United States Patent [19]

Machado

[11] Patent Number: 4,675,652
[45] Date of Patent: Jun. 23, 1987

[54] INTEGRATED ENCODER DECODER FOR VARIABLE LENGTH, ZERO RUN LENGTH LIMITED CODES

[75] Inventor: Michael G. Machado, San Jose, Calif.

[73] Assignee: Quantum Corporation, Milpitas, Calif.

[21] Appl. No.: 850,850

[22] Filed: Apr. 11, 1986

[51] Int. Cl.⁴ .............................................. H03M 7/00
[52] U.S. Cl. .............................. 340/347 DD; 360/40; 340/347 C
[58] Field of Search .................. 360/40; 340/347 DD, 340/347 C

[56] References Cited

U.S. PATENT DOCUMENTS 3,689,899  9/1972  Franaszek .................... 340/347 DD

OTHER PUBLICATIONS

Miessler "IBM Technical Disclosure Bulletin" vol. 17, No. 5, Oct. 1974, pp. 1489-1491.

Primary Examiner—Charles D. Miller
Attorney, Agent, or Firm—David B. Harrison

[57] ABSTRACT

An encoder-decoder apparatus is disclosed for encoding and decoding code words of a predetermined code scheme in which which ONE bits thereof are separated by at least d ZERO bits and not more than k ZERO bits, in a serial bit stream path from and to components of serial data words each being of n parallel data bits in a data word transmission path, wherein the number of bits of each code word bears a three to two relation with respect to the number of bits of each component of the data word, and where n equals an even integer. The encoder-decoder includes an encode/decode clocked shift register connected to the serial bit stream path for receiving and framing each incoming code word and for putting out each framed incoming code word in parallel bit format, and for receiving each outgoing code word in parallel bit format and for putting out each outgoing code word into the serial bit stream path; an encode/decode serializing and deserializing shift register latch connected to the data word transmission path for receiving and latching each data word coming in from, and for receiving and latching each present data word going out to, the data word transmission path; an encoder for encoding, and a decoder for decoding. The serializing and deserializing shift register latch is clocked at a first rate corresponding to the latching of each incoming and outgoing data word of n bit length and a second rate by which the shift register latch is shifted by the number of bits of the data word component.

6 Claims, 6 Drawing Figures

INTEGRATED ENCODER DECODER FOR VARIABLE LENGTH, ZERO RUN LENGTH LIMITED CODES

BACKGROUND OF THE INVENTION

The present invention relates to encoding and decoding apparatus for variable length, run length limited binary codes in computing apparatus. More particularly, the present invention relates to integrated apparatus for encoding and decoding of binary data in accordance with variable length, run length limited codes in which three code bits correspond to two data bits for increasing storage densities in computer online mass storage subsystems, such as rotating disk data storage devices.

It is known to use variable length, zero run length limited coding processes in order to increase the density with which binary data may be recorded on rotating magnetic media storage disks, and similar applications. In such applications, a binary ONE represents a magnetic flux transition (or other change of state) while a binary ZERO represents no change of magnetic state or condition. Adjacent ONEs (or changes of state) are ideally separated by some minimum number of ZEROs by the coding process in order to reduce the undesirable effects upon magnetic media of unduly crowded adjacent flux transitions (called "pulse crowding").

On the other hand, since reliable data recovery from magnetic storage media depends upon relatively frequent occurrences of flux transitions or changes of state in order to enable synchronization of decoding and data recovery apparatus, some maximum length of consecutive zeros (called "zero run length") is implemented as some small integer, usually less than ten. An ideal code for a particular application results in a compromise between the code rate (i.e., the number of code word bits per data bit) and the transition interval between flux transitions: the smaller the code rate, the higher the aerial data storage density; and, the longer the run length of zeros the lesser the effect of pulse crowding and resultant distortion and error in the decode process.

A theoretical explanation as well as a discussion of practical advantages and benefits of a code employing a code rate of three code bits to two data bits, a run length of zeros between one and seven, and a variability factor of two, is set forth in an article entitled "An Optimization of Modulation Codes in Digital Recording" by T. Horiguchi and K. Morita, in IEEE Transactions on Magnetics, Vol. MAC-12, No. 6, Nov. 1976, pp. 740-742.

An implementation of the principles described in the above-referenced article is found in a later U.S. Pat. No. 4,337,458 to Cohn, Jacoby and Bates, entitled "Data Encoding Method and System Employing Two-Thirds Code Rate with Full Word Look-Ahead". That prior patent described separate encoding and decoding apparatus for encoding and decoding a somewhat cumbersome three to two code which did not employ encode and decode logic-minimized state machines. Rather, the apparatus disclosed in that patent had the drawback of complexity in requiring the use of look up values stored in read-only memories (ROM) in order to provide the code translation in both the encoder and in the decoder. A flag signal was also generated and fed forward, latched, and then fed back in order to change ROM addressing whenever a six bit code word combination was required by the coding process in order to be sure that the three to two code did not result in adjacent binary ONEs in the code word bit stream. The use of separate encoder and decoder apparatus added to the complexity and cost of that implementation, and the use of look up tables stored in ROM meant that large scale integration of that apparatus on a single chip was cumbersome and difficult. Also, circuit elements performing similar functions were duplicated in the separate encoder and decoder, with little or no thought given to combining of functions into common circuit elements to promote efficiency and to minimize topology required in an implementation based in a single very large scale integrated circuit.

Other prior art methods and apparatus for 1,7 coding processes are found in U.S. Pat. No. 4,413,251 which discloses an encoder and decoder which are separate structures, and U.S. Pat. No. 4,488,142, which also disoloses separate encoder and decoder structures. These prior art references have a number of differences and complexities made unnecessary by the present invention.

SUMMARY OF THE INVENTION WITH OBJECTS

A general object of the present invention is to provide a highly integrated encoder and decoder structure for encoding and decoding binary data in accordance with variable length, run length limited codes in which three code bits correspond to two data bits in order to increase storage densities in data storage devices such as rotating disk data storage devices in a manner which overcomes limitations and drawbacks of the prior art.

A specific object of the present invention is to provide a circuit-element-optimized implementation of an encoder-decoder which integrates similar functions into common circuit elements to reduce duplication of common circuit elements.

Another object of the present invention is to provide an encoder-decoder which employs a variable length, run length limited code selected to minimize the amount of hardware required for encoding and decoding implementation.

A further object of the present invention is to provide encoder-decoder apparatus which may be readily integrated into and combined with data sequencer functions of a storage device controller.

One more object of the present invention is to provide simplified apparatus for generating and detecting the presence of sync and preamble bit patterns to ensure that code words may be properly framed during decoding operations.

One more object of the present invention is to provide encoder-decoder apparatus which may be formed as a portion of a single large scale integrated circuit implementing controller electronics for a data storage device such as a rotating magnetic media disk drive.

In accordance with the principles of the present invention, integrated encoder-decoder apparatus encodes and decodes code words in a serial bit stream path leading to the data storage device from and to components of serial data words each being of n parallel data bits in a data word transmission path leading to a host equipment such as a computing system, wherein the number of bits of each code word bears a three to two relation with respect to the number of bits of each component of the data word, and where n equals an even integer. The encoder-decoder apparatus includes the following elements:

A clocked shift register is connected to the serial bit stream path for receiving and framing each incoming code word and for putting out each framed incoming code word in parallel bit format, and for receiving each outgoing code word in parallel bit format and for putting out each outgoing code word into the serial bit stream path.

A serializing and deserializing shift register latch is connected to the data word transmission path for receiving and latching each data word coming in from, and for receiving and latching each present data word going out to, the host equipment connected to the data transmission path. The serializing and deserializing shift register latch is clocked at two rates, a first rate corresponding to the latching of each incoming and outgoing data word of n bit length and a second rate by which the shift register latch means is shifted by the number of bits of the data word component. The serializing and deserializing shift register latch also includes a preceding component storage position for latching each component immediately preceding a present component of an incoming data word to be encoded.

An encode logic circuit is connected to predetermined positions of the serializing and deserializing shift register latch including the position corresponding to the immediately preceding component and the position corresponding to the present component to be encoded. The encode logic circuit is also connected to the clocked shift register and it encodes components making up each data word into code words and sends the code words to the clocked shift register. The encoding operation being performed by the encode logic circuit is in accordance with a predetermined code scheme which generates the stream of variable length code words in which ONE bits thereof are separated by at least d ZERO bits and not more than k ZERO bits, where d and k are single digit integers.

A decode logic circuit is connected to the clocked shift register and to the serializing deserializing shift register latch, and this logic decodes incoming code words into data word components in accordance with the predetermined code scheme, and it sends each decoded component into the serializing deserializing shift register latch wherein the components are framed into each parallel bit data word which is then sent out to the data word transmission path.

A state machine control circuit is connected to control operations of the clocked shift register, the serializing deserializing shift register latch, the encode logic circuit and the decode logic circuit so that the encoder-decoder may function as an integrated unit.

In one aspect of the present invention, the encoder-decoder employs a variable length, run length limited code wherein the minimum number of ZEROs d equals one and the maximum number of ZEROs k equals seven, and code words are either three bits or six bits in length with a code ratio of three to two.

In another aspect of the present invention, the encoder-decoder apparatus encode and decode in accordance with a logic element minimized code as follows:

CODE TABLE

| Previous Data Component | Present Data Component | Previous Code Word | Present Code Word |
| --- | --- | --- | --- |
| 00 | 00 | 001 | 001 |
| 00 | 01 | 001 | 000 (Double Gp) |
| 00 | 10 | 001 | 010 |
| 00 | 11 | 010 | 000 (Double Gp) |
| 01 | 00 | 101 | 001 |
| 01 | 01 | 101 | 000 (Double Gp) |
| 01 | 10 | 101 | 010 |
| 01 | 11 | 100 | 000 (Double Gp) |
| 10 | 00 | 010 | 001 |
| 10 | 01 | 010 | 101 |
| 10 | 10 | 010 | 010 |
| 10 | 11 | 010 | 100 |
| 11 | 00 | 100 | 001 |
| 11 | 01 | 100 | 101 |
| 11 | 10 | 100 | 010 |
| 11 | 11 | 100 | 100 |

In a further aspect of the present invention, the integrated encoder-decoder apparatus includes a synchronization field detector for detecting the presence of a sync field in a sector header.

In one more aspect of the present invention, the integrated encoder decoder apparatus includes a preamble detector for detecting the presence of a preamble within a sync field in a sector header.

In one further aspect of the present invention the encode logic circuit generates preamble and sync fields of a plurality of patterns, such as 101010 and 100100, upon receipt of a control signal.

These and other objects, advantages and features of the present invention will be better appreciated by considering the following detailed description of a preferred embodiment, presented in conjunction with the accompanying drawings.

DETAILED DESCRIPTION OF A PREFERRED EMBODIMENT

Figure 1:
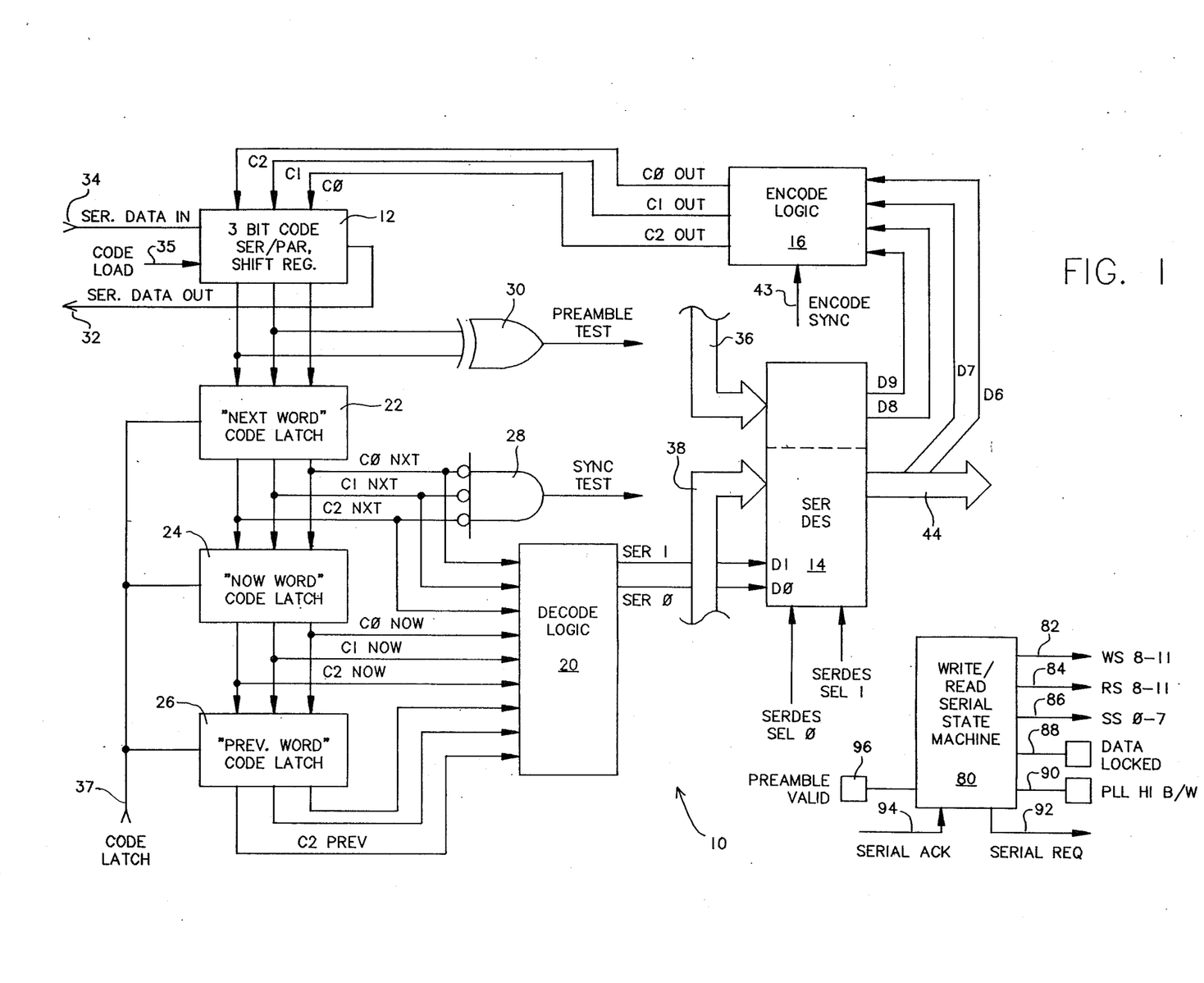
FIG. 1 is an overall symbolic block diagram of an integrated encoder-decoder apparatus in accordance with the present invention.

An integrated encoder-decoder apparatus 10 incorporating the principles of the present invention is set forth in overview in FIG. 1. Therein, the apparatus 10 is depicted as a portion of a data controller integrated circuit architecture for inclusion preferably as part of a single large scale integrated circuit within the electronics of a rotating disk data storage subsystem, such as the subsystem described in the common assignee's copending U.S. patent application Ser. No. 06/834,009 filed on Feb. 27, 1986 for High Capacity Disk File with Embedded Sector Servo, reference being made thereto for further particulars.

As depicted in the FIG. 1 overview, the apparatus 10 includes five major elements: a three bit code serial/parallel clocked shift register 12, a serializing deserializing shift register latch 14 (see FIG. 2), an encode logic circuit 16, a decode logic circuit 18, and a write/read serial state machine control circuit 80. The shift register 12, encoder logic circuit 16 and decode logic circuit 18 are depicted structurally in FIG. 3 in which identifications are provided for discrete TTL logic devices in order to provide further clarity of understanding by those skilled in the art (equivalent circuit elements being included as standard gates within the preferred large scale integrated circuit package implementation of the apparatus 10). The decode logic circuit 18 includes decoder logic 20 and and three latches: a "next word" latch 22, a "now word" latch 24, and a "previous word" latch 26. The state machine control circuit 80 controls operations of the shift register 12, serializing deserializing register 14, encoder circuit 16 and decoder circuit 18 in accordance with the states set forth in FIGS. 4, 5A and 5B. Each of these circuit elements is described in greater detail hereinafter.

Synchronization of data recovery circuits (not shown) to a stream of serial data being read from e.g. a rotating magnetic medium such as a disk surface is facilitated by provision of a preamble pattern at the beginning of each data block to be recorded ("written") and played back ("read"). A code word data stream pattern of 010101010101010, etc. of predetermined bit length is preferably incorporated into the preamble of each data block. This pattern subjects the data storage medium to the highest transition density and thereby facilitates positive and rapid phase lock of the data recovery circuitry to the incoming code word data stream during read and decode operation. The preamble pattern is detected by a twobit exclusive OR gate 30 connected to the C2 and C1 bit output positions of the shift register 12. This alternating bit preamble pattern is encoded and put out by the encoder 16 whenever an ENCODE SYNC line 43 is active. This line 43, when active, forces the encode state machine 16 to put out the desired preamble pattern into the encoded data stream to be written upon the magnetic storage medium.

After the preamble pattern is detected it is useful to detect several identical three bit code words providing a synchronizing pattern. Each three bit code word may be established by provision within the synchronization field of several recurrent code word patterns, such as 100100. These patterns, corresponding to data bit components 11, 11, (or FF HEX) are detected by a three-bit NAND gate 28 connected to the output side of the "next word" latch 22. The recurrent code word patterns are encoded by the encoder 16 whenever an "Encode Sync" line 43 is active. This line forces the encoder 16 to put out either the preamble pattern or the sync pattern, depending upon whether the state machine control 80 commands one shift of the register 12 between loads which produces the 101010 pattern, or two shifts of the register 12 between loads which produces the 100100 pattern.

Shift Register 12

Figure 3:
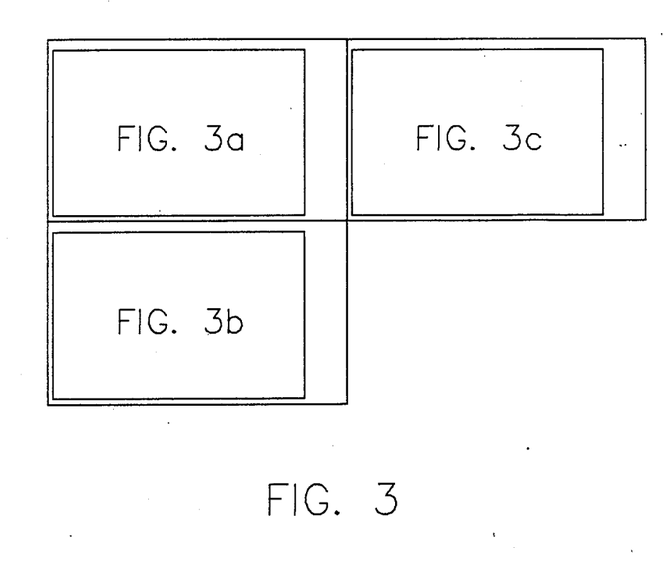
FIG. 3 is a layout plan for FIGS. 3a, 3b and 3c which together comprise a detailed logic and block diagram of encode/decode portions of the encoder-decoder apparatus depicted in FIG. 1.
Figure 3A:
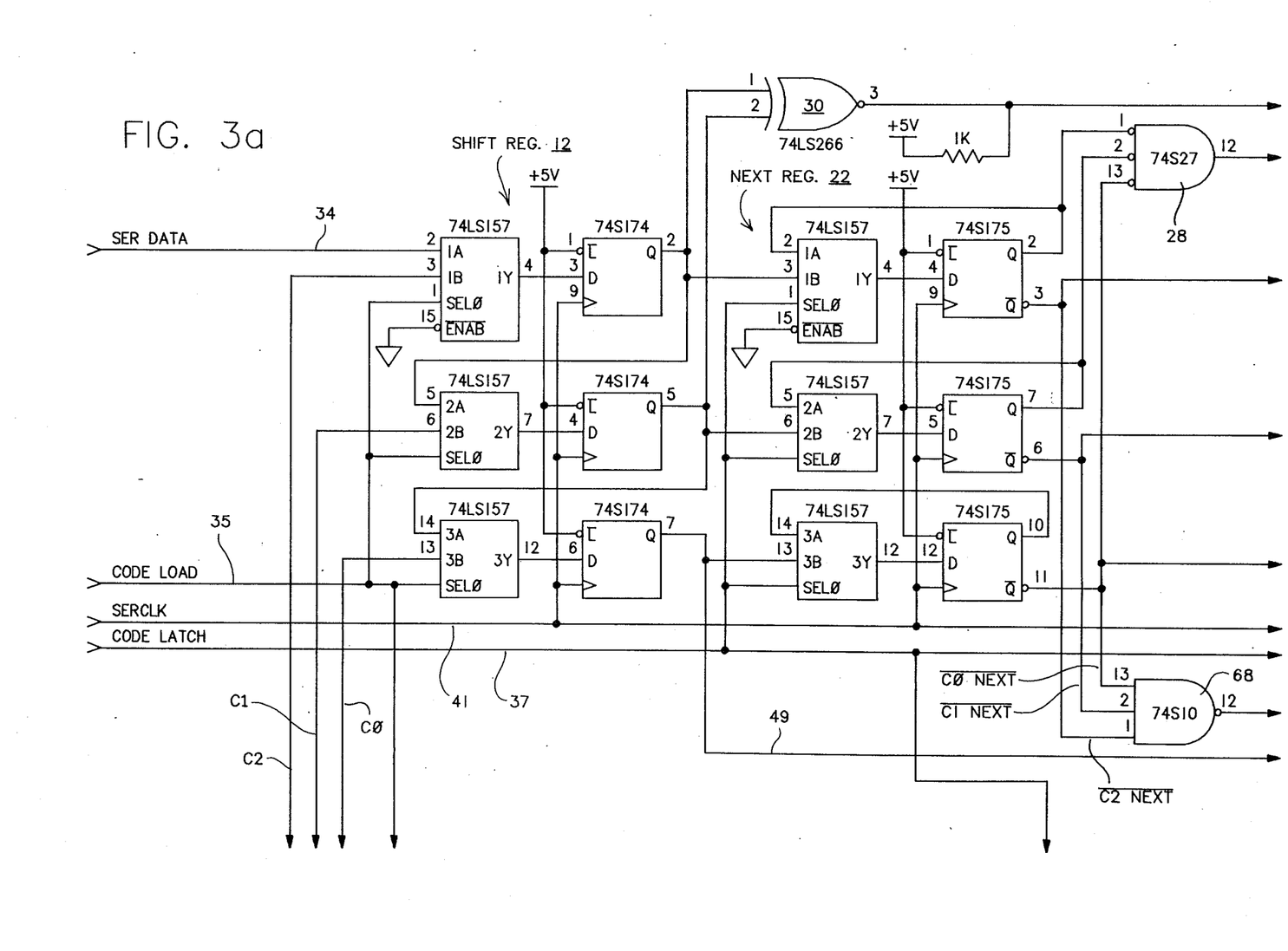
Figure 3B:
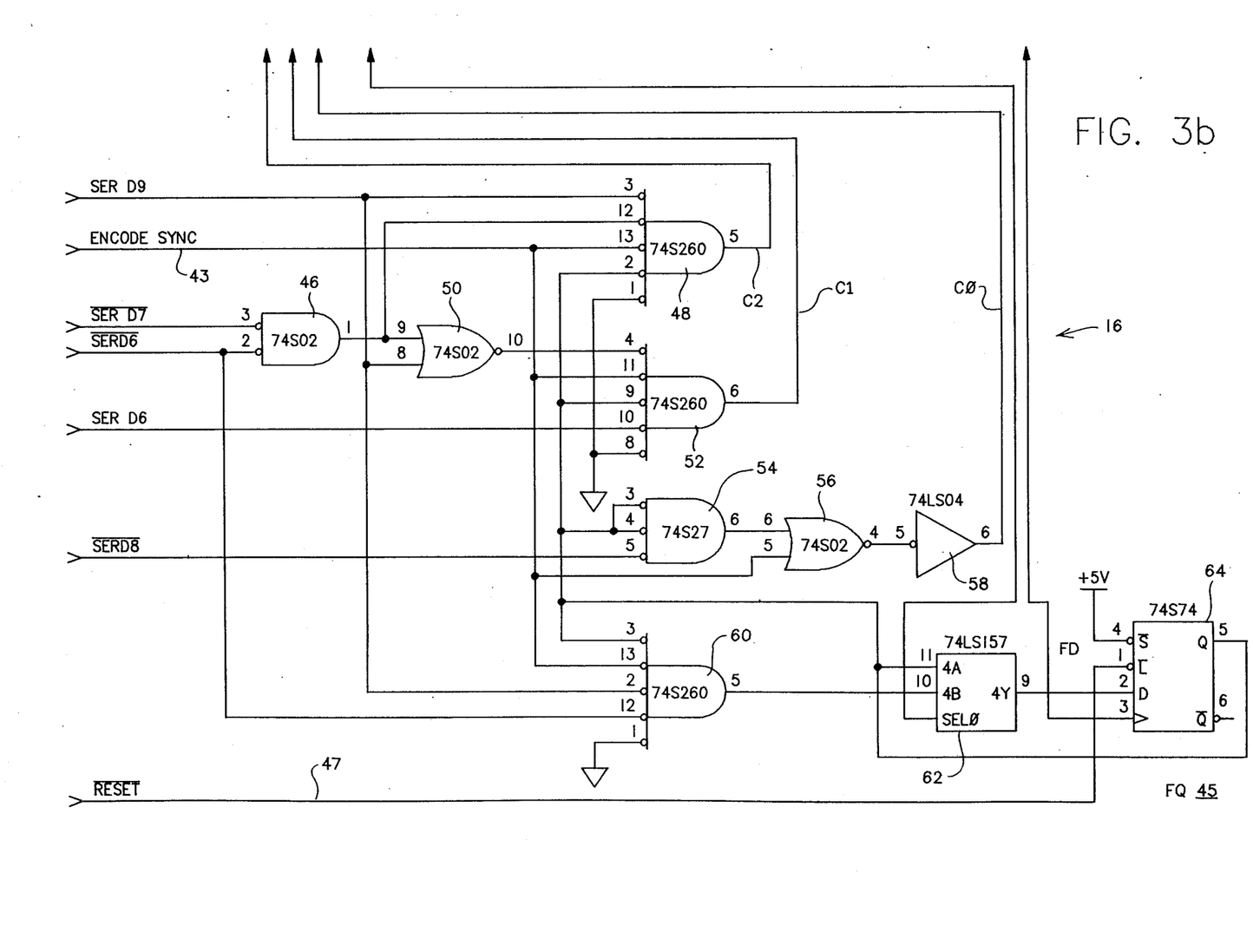
Figure 3C:
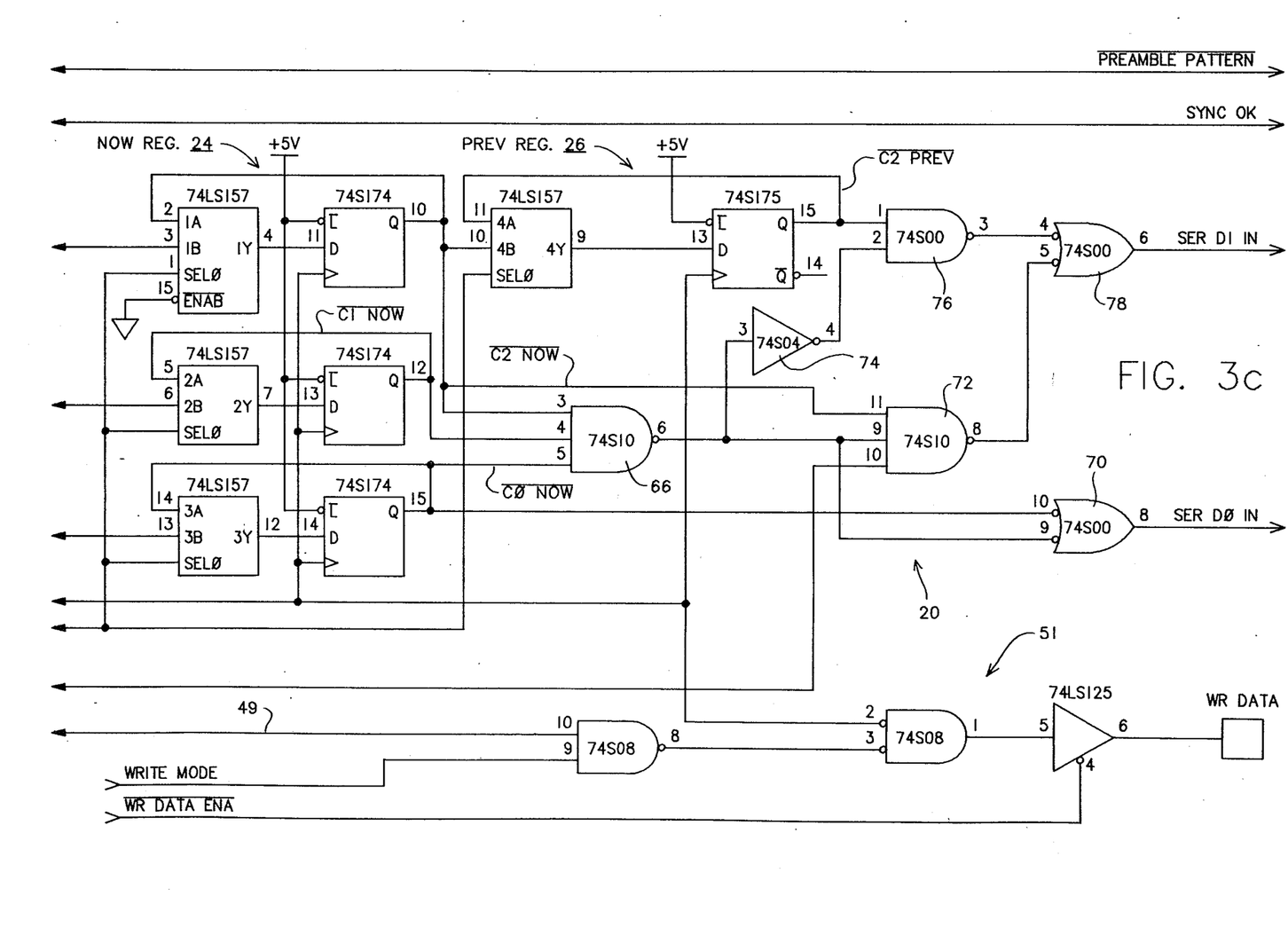

When a Code Load control line 35 is active, input data selectors of the shift register 12 select and latch the three bit output C2, C1 and C0 put out from the encoder 16 to begin the serialization of encoded data which is put out over a line 49 and through write control circuitry 51, as shown in FIG. 3. Shifting operations in the shift register 12 occur in response to the serial clock control signal on a line 41

One function of the shift register 12 is to translate the three-bit code words from the encode logic 16 into a serial bit data stream which is put out to the storage device via a serial output line 32. The other function of the shift register 12 is to frame serial bits incoming on a serial data input line 3 into three-bit code words for stepping in turn through the "next word" latch 22, "now word" latch 2, and "previous word" latch 26 in bucket brigade fashion. The three bit words in each latch 22, 2 and 26 are framed in response to a Code Latch control signal on a line 37.

SERDES 14

Figure 2:
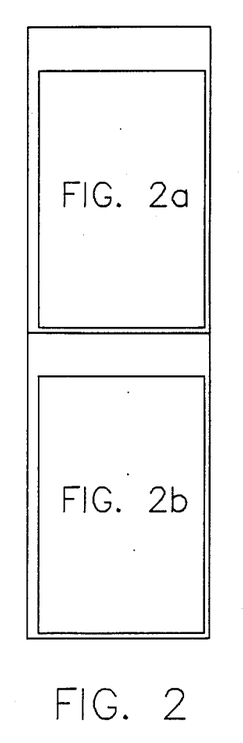
FIG. 2 is a layout plan for FIGS. 2a and 2b which together comprise a logic block diagram of a serializing and deserializing shift register latch of the integrated encoder-decoder apparatus of FIG. 1.
Figure 2A:
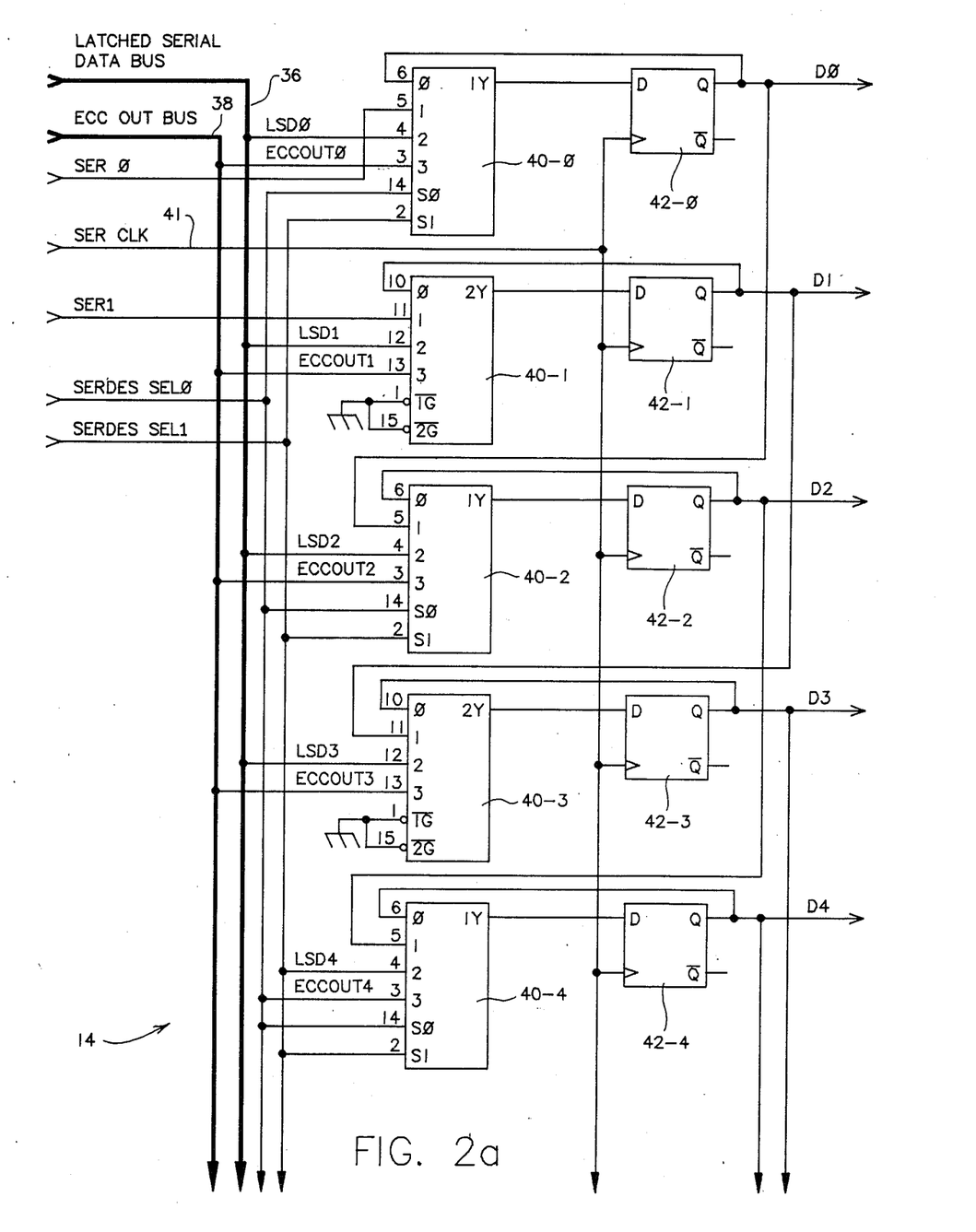
Figure 2B:
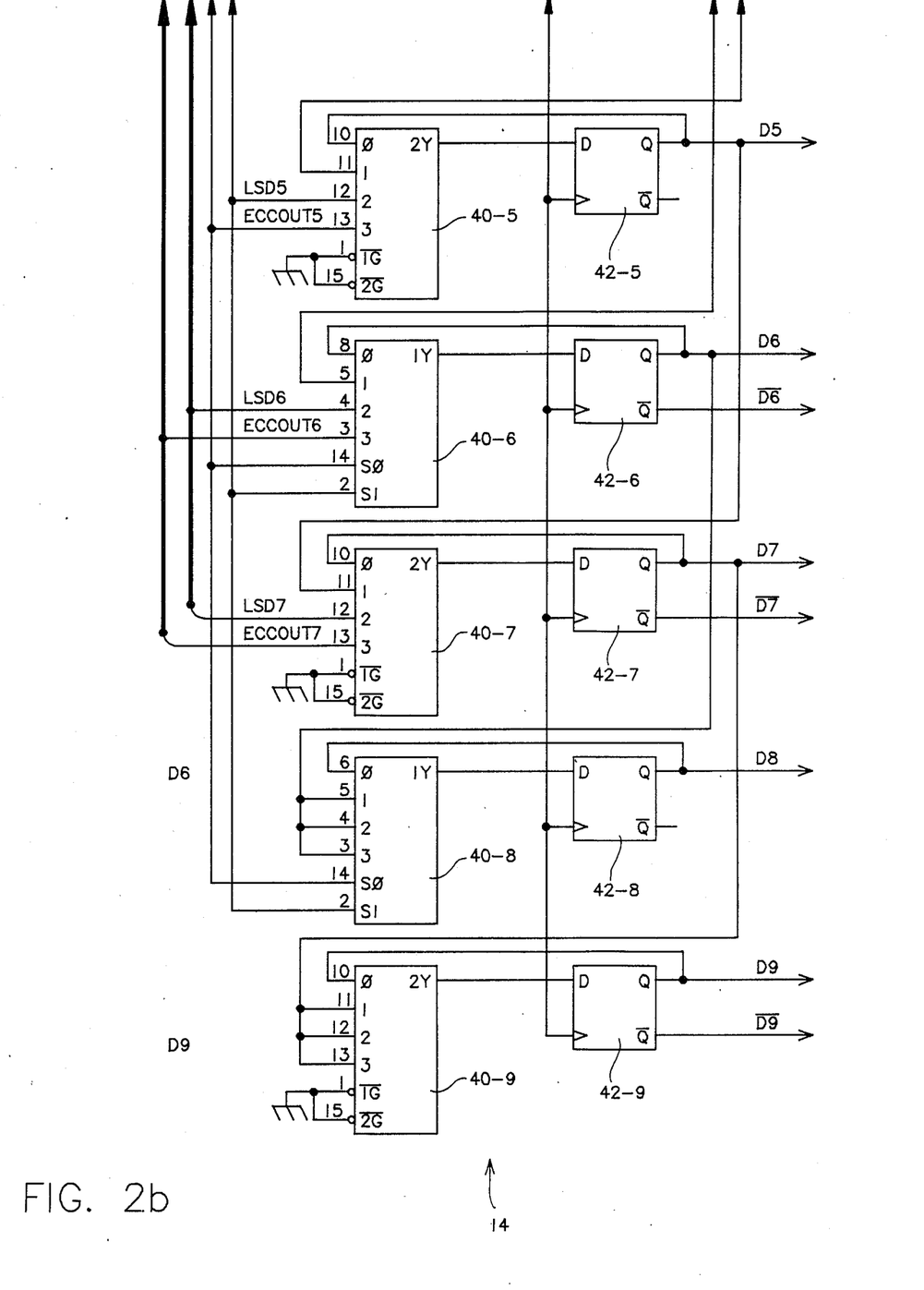

Referring now to the serializing/deserializing shift register latch (SERDES) 14 depicted in structural detail in FIG. 2, one eight bit parallel data bus 36 provides latched serial data words from a data sequencer functional element of the storage subsystem with which the apparatus 10 is associated. These words are sent serially by word, parallel by bit over the bus 36 into the SERDES 14. Another bus 38 provides error correction code syndrome words from an error correction code syndrome generator element of the storage subsystem. The error correction code words are inserted to follow each block of data which is to be written on the magnetic media data storage surface. The actual value of each error correction code word depends upon characteristics of the data word block in accordance with a predetermined error correction code arrangement.

The SERDES 14 shifts at two rates, a first rate which latches each eight bit data word from one of the buses 36, 38, and at a second rate which is a two bit serial shift, so that the three code bits to two data bits code rate conversions may be carried out in the encode and in the decode modes.

Two low order (D0 and D1) data bits enter the SERDES 14 from the decode logic 20 on lines SER 0 and SER 1. This path marks the entry from the decode logic 20 into SERDES 14 for decoded data which SERDES frames into eight bit words. A plurality of high order data bits and one complement (D6, D7, D8 D9 and BAR D9) are sent from SERDES 14 to the encode logic 16. This path marks the entry from SERDES 14 of unencoded data into the encoder.

Referring to FIG. 2, the SERDES 14 is preferably implemented as an array of multiplexers 40-0, 40-1, 40-2, 40-3, 40-4, 40-5, 40-6, 40-7, 40-8, and 40-9 each of which is connected respectively to an associated D flip-flop latch 42-0, 42-1, 42-2, 42-3, 42-4, 42-5, 42-6, 42-7, 42-8 and 42-9 (the dash suffix in the reference numeral refers to the data bit position, thus multiplexer 40-9 and latch 42-9 both refer to data bit 9.

All of the flip-flop latches 42 are clocked in parallel in response to a clocking signal appearing on a "serial clock" control line 41. The data appearing at the output of the multiplexers 40 will thereupon be latched into the latches 42. The selection of data from among four possible inputs, including the latched serial data bus 36, the ECC bus 38, and the SER 0, SER 1 lines, is controlled by the control signals present on two control lines "SERDES select 0" and "SERDES select 1", in accordance with the following table:

| SERDES SEL 1 | SERDES SEL 0 | FUNCTION |
| --- | --- | --- |
| 0 | 0 | hold |
| 0 | 1 | load serial pair/shift two bit positions |
| 1 | 0 | load data byte from bus 36 |
| 1 | 1 | load ECC byte from bus 38 |

The Q output of each flip-flop 42 is connected to a fourth available input of a data multiplexer 40 at two levels below the particular flip-flop 42. For example, the Q output of the flip-flop 42-0 is connected to a data input of the multiplexer 40-2, and the Q output of the flip-flop 42-1 is connected to a data input of the multiplexer 40-3, and so forth, as shown in FIG. 2. These two-bit staggered inputs are commonly controlled with the SER 0, SER 1 lines, so that a decoded two-bit data component may be entered into the SERDES 14 over the lines SER 0 and SER 1 and then shifted, two bits at a time, throughout the length thereof.

When four two-bit decoded data components have been latched and shifted in the SERDES 14, an eight bit data word is thereupon framed, and that word may now be read out of the SERDES 14 over a parallel data output bus 44 extending to e.g. the data sequencer element of the overall data storage subsystem.

Encoder 16

Referring to FIG. 3, one preferred implementation of the encode logic state machine 16 is illustrated. This implementation includes only eight gate logic elements, a 2:1 selector, and a D flip-flop, configured as shown. The output lines D6, D6 BAR, D7 BAR, D8 BAR, and D9 enter the encode logic 16 from the SERDES 14.

The D6 BAR and D7 BAR output lines from the SERDES 14 are connected to a two-bit NOR gate 46. The output from the gate 46 enters a 5-bit NAND gate 48 which also includes inputs from the lines D9, the ENCODE SYNC line 43, and an FQ line 45. The gate 48 provides an encoded high order bit C2 as its output.

A second 5-bit NAND gate 52 provides an encoded middle order bit C1 as its output. Its five inputs include the ENCODE SYNC line 43, the FQ line 45, the D6 line, and the output from a 2-bit NAND gate 50 whose inputs are the D9 line and the output from the gate 46.

An encoded low order bit C0 is provided by operation of three gates, a 2-bit NAND gate 54, a 2-bit NAND gate 56 and an inverter 58. One input to the gate 54 is provided by the D8 BAR line and another is the FQ line 45. The inputs to the gate 56 are the output of the gate 54 and the ENCODE SYNC line 43. The output of the gate 54 is inverted by operation of the inverter 58 in order to provide the encoded low order bit C0.

A 5-bit NAND gate 60 receives inputs from EN-CODE SYNC line 43, the FQ line 445, the D9 line, and the D6 BAR line. The output from the gate 60 leads to a select B input of a 2:1 selector 62. The 2:1 selector 62, controlled by the Code Load control line 37, receives its select A input from the FQ line 45 leading from the non-inverting Q output of a D flip-flop 64. The selector 62 selects the B input whenever the Code Load control line 35 is active; otherwise the selector 62 selects the FQ line 45.

The flip-flop 64 is clocked by the Serial Clock control signal on the line 41 and it thereupon latches the output of the selector 62. The flip-flop 64 is reset by a signal on a Reset control line 47. This flip-flop generates the FQ indicator signal which flags the need to encode data bit pairs with different code words which are appropriate for a "double group", as set out in the Code Table above.

Decoder 20

The decode logic state machine 20 is simpler yet. It includes two three input NAND gates 66, 68 which receive inputs from the "now" and "next" latches 24, 22 as shown in FIG. 2. The gate 68 sends its output into a three input gate 72, the other inputs of which come from the output of the gate 66 and a C2NOW BAR line.

A two input NAND gate 70 receives its inputs from the output of the gate 66 and from the non-inverting output of the low order bit position of the Now Register 24. The NAND gate 70 puts out the low order D0 bit position of decoded data.

The output from the gate 66 also leads through an inverter 74 to the input of a two bit NAND gate 76 which obtains its other input from the non-inverting output of the high order bit position of the Previous Register 26. The output from the gate 76 provides one input to a two bit NAND gate 78 having an output which provides the high order D1 bit position of decoded data. The other input for the gate 78 comes from the output of the gate 72 which obtains its inputs from the gates 66 and 68 and from a C2NOW BAR line leading from the non-inverting output of the high order bit position of the Now Register 24.

Further understanding of the operation of the encoder-decoder 10 in accordance with the principles of the present invention will be obtained by considering the operation of the state machine controller 80. This machine, FIG. 1, includes write state control lines 82, read state control lines 84, serial state control lines 86, a data locked test in line 88 which indicates that the state machine is syncronized to the data, a PLL high bandwidth line 90 which indicates that the phase locked loop of the data recovery circuit has a low inertia state so that it may promptly lock onto a preamble field of an incoming data block, a serial request line 92 which signals that a data word is framed in SERDES 14 and is ready to be read on the bus 44, a serial acknowledgement line 94 which indicates that a master controller successfully obtained the serial data word from the bus 44, and a preamble valid line 96 which indicates that the preamble pattern has been tested valid at the gate 30. This control machine 80 operates in accordance with the state diagrams set forth in FIGS. 4, 5A and 5B which illustrate the encoding and decoding operations of the apparatus 10. In these diagrams, a circle depicts a stable state, while a triangular figure depicts an event which occurs on a switching edge between two stable states.

Figure 4:
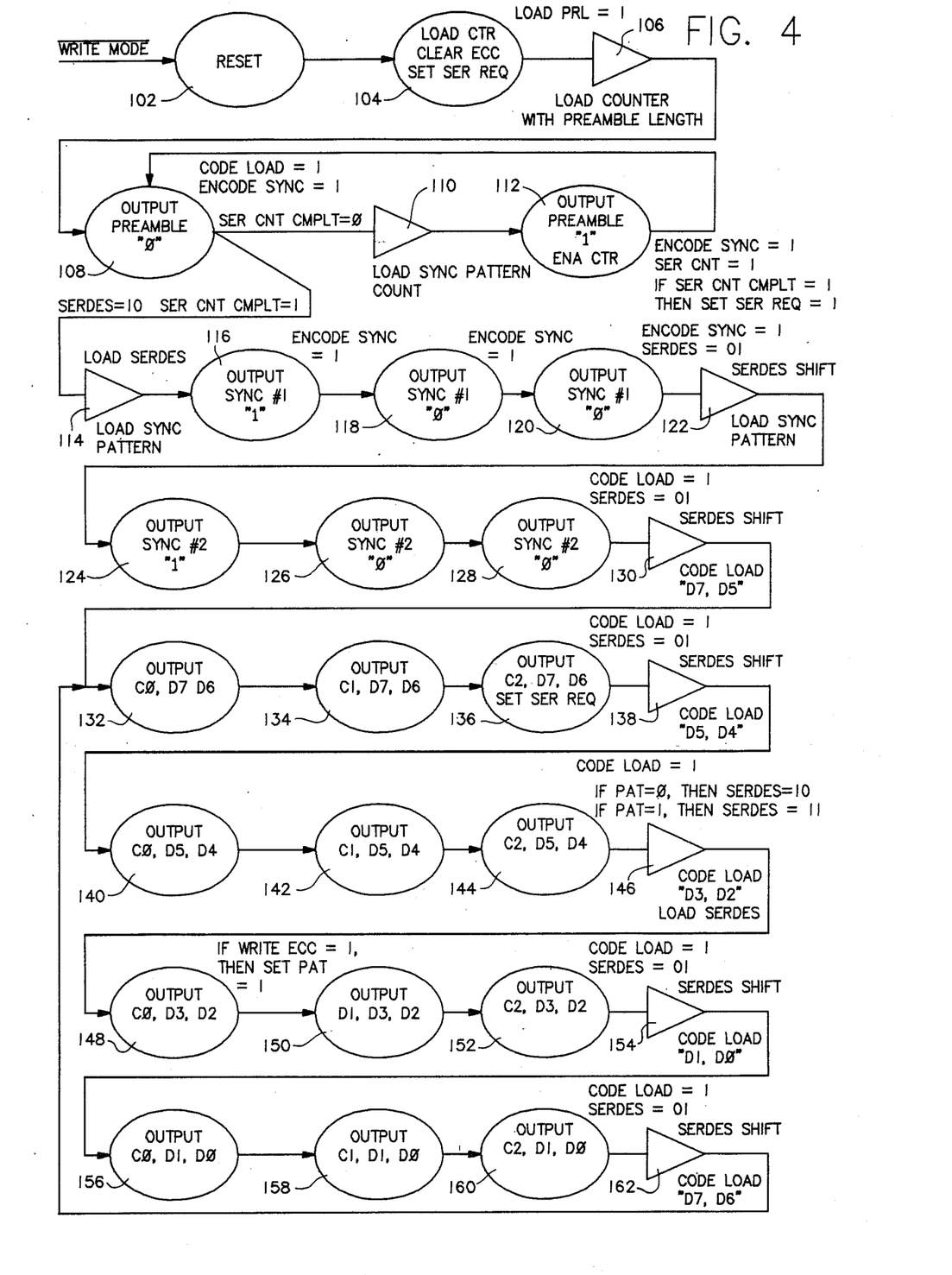
FIG. 4 is a state diagram illustrating the sequences generated by the state machine control circuit for the encoding process of the integrated encoder-decoder apparatus of FIG. 1.

Encode Process (FIG. 4)

Encoding operations begin with a reset command at a state 102. A write mode BAR command line is active at this time in order to signal that the encoding process is to commence. At a state 104, registers and counters are reset with clear or initial values. The serial request line 92 is set and the master controller obliges by delivering a first data word to the SERDES 14, after which time, the serial acknowledge line 94 is active. At a transition edge 106, the length in bits of the preamble of a block of data is set into a preamble length counter.

At a state 108 a preamble zero (0) bit is put out, the code load line 35 is high, the encode sync line 43 is high and the serial count complement is low, meaning that the preamble length counter has not yet decremented to a zero count. If the remaining count in the preamble counter is greater than zero, a sync pattern count is loaded at an edge 110, and a preamble one (1) is put out at a state 112. At this state the encode sync line 43 is high, the serial count is high. If the serial count complement is high, then the serial request line is set high. This process of putting out zeros and ones continues by loop back to state 108, until the count in the preamble length counter reaches zero.

When that occurs, the serial count complement goes high, and the sync pattern (such as 100100) is generated. At a transition 114, the first data word is loaded into SERDES 14, and the sync pattern is loaded into the latch 12. A one bit of the first word of sync pattern is put out at a state 116, at which point the encode sync line 43 is high; a first zero bit thereof is put out at a state 118, at which point the encode sync line 43 is high; and a second zero of the first word of sync pattern is put out at a state 120, at which the encode sync line 43 is high and the state of SERDES select lines are 0, 1.

The SERDES 14 is shifted by two bits at a transition 122 while the sync pattern is loaded into the latch 122. This process moves the high order two bits of the first data word into encode position in SERDES 14 while the last sync word is being put out at states 124, 126 and 128. At the state 128 the code load line 35 is high.

At a transition 130 the SERDES 14 is shifted by two bits, and the two high bit positions D7 and D6 of the first data word are then encoded insofar as the C0 value is concerned at a state 132. At the next sequential state 134, these high bit positions D7 and D6 are encoded and put out with respect to the C1 value, and they are encoded and put out with respect to the C2 code bit position value at a state 136, which also includes the setting high of the serial request line 92.

At the next transition 138 the SERDES 14 is again shifted by two bits at a state 138 and the D5 and D4 bit positions of the data word are loaded. These positions are then processed with respect to C0, C1 and C2 at states 140, 142 and 144. Next, SERDES 14 is again shifted by two bits at a transition 146 and the D3 and D2 positions are loaded. At this point in the process, the D3 and D2 bits are now located in SERDES at the D9 and D8 positions respectively, and the D1 and D0 bits are located at the D7 and D6 positions. At this state 146, the next eight bit data word to be encoded is latched into the SERDES 14 as a parallel data latching operation. A block length counter PAT determines whether the next word is a data word or an error correction code word and so signals the SERDES 14 at this point.

Meanwhile, the D3 and D2 bits are processed for encoding at states 148, 150 and 152. Then, SERDES 14 is shifted by two bits at a transition 154 and the low order bit positions D1 and D0 of the eight bit data word are finally loaded into the D9 and D8 positions, and the next data word is loaded into positions D7–D0 of the SERDES 14. The D1 and D0 bits are encoded as with the other data bit pairs at states 156, 158 and 160.

At a transition 162 the next data word (or error correction code word as the case may be) has already been latched into SERDES 14 in a parallel operation occurring at the state 146. Thus, when the SERDES 14 is shifted again by two bits, the two high order bits of this next eight bit word to be encoded (D7 and D6 of next word) are shifted into the D9 and D8 positions of the SERDES 14 for encoding. Then, the encoding process returns to the state 132, whereupon the states following the state 132 are repeated for this next word. This encoding process continues until all of the eight bit data words of the data block (and subsequent error correction code words) have been encoded, as determined by a block word count counter reaching zero.

Figure 5A:
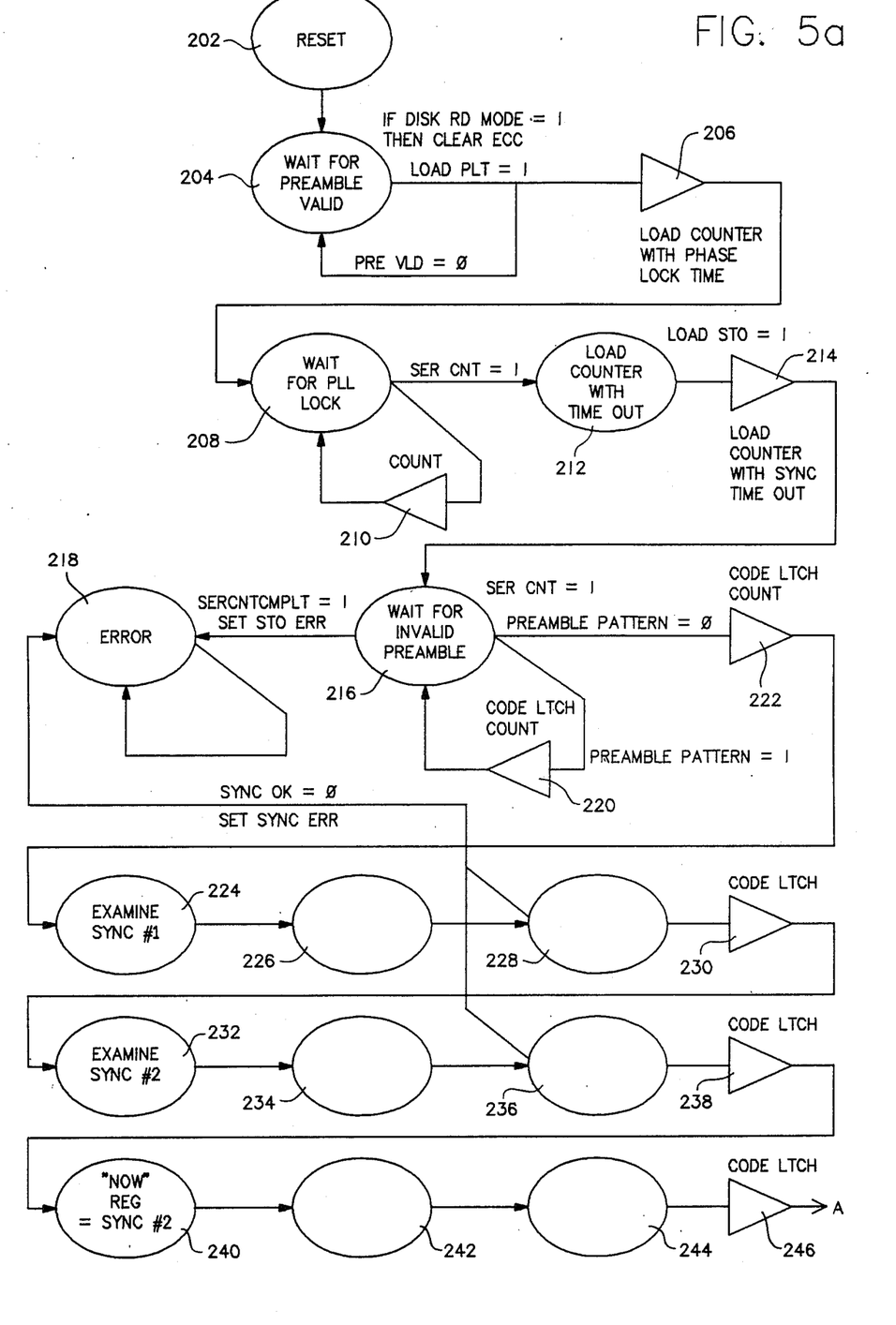
FIGS. 5a and 5b are a single state diagram illustrating the sequences generated by the state machine control circuit for the decoding process of the integrated encoder-decoder apparatus of FIG. 1.
Figure 5B:
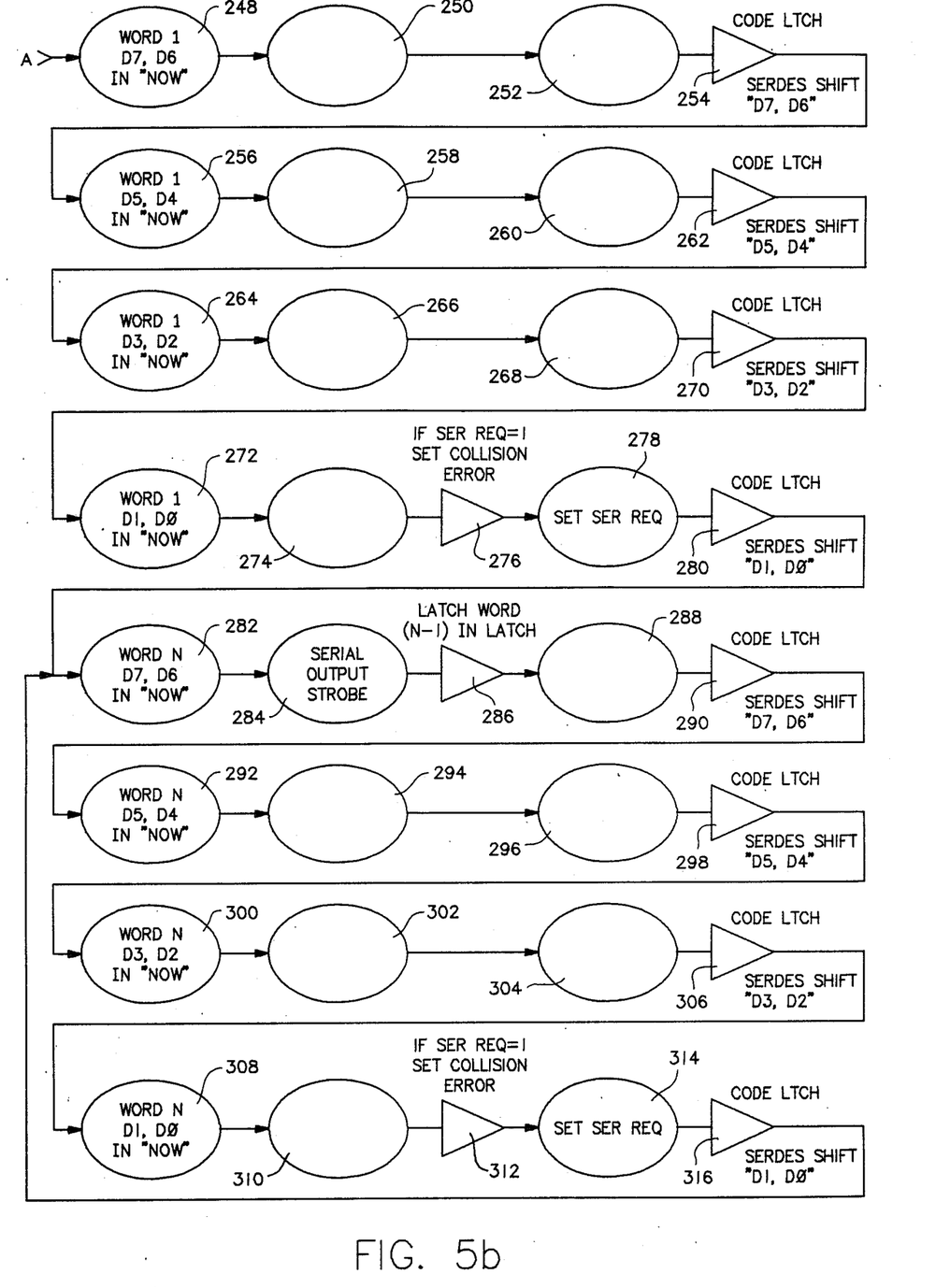

Decode Process, FIGS. 5A and 5B

When read together, FIGS. 5a and 5b depict the operation of the state machine 80 of the apparatus 10 in causing decode operations to be carried out. The apparatus 10 is reset at a state 202 at which the Write Mode BAR control line is now inactive. The process waits for detection of a valid preamble by the preamble valid detector gate 30 at a state 204. If the preamble is not valid, the apparatus 10 loops at the state 204 until the preamble tests valid, at which point the process moves to state 206 where a preamble counter is loaded with the phase lock time. A wait state 208 is provided for lock-on by the data recovery phase lock loop.

A count increment transition 210 causes the count in a serial counter to be incremented by one and returns to the state 208. When the serial count goes high, signifying that the predetermined wait at the state 208 has expired, a preamble count time out value is loaded into a preamble counter at a state 212 and a sync count time out value is loaded into a sync time out counter at a transition 214. A wait state 216 follows until a valid preamble is detected. If the preamble time out counter reaches a zero count, an error state 218 is entered and decode of the blcck is attempted during the next revolution of the disk.

The state machine loops at a transition 220 back to the wait state 216 until the preamble pattern is validated by the preamble test gate 30. Once a valid preamble is detected as indicated by a Preamble Pattern BAR (low) signal, the process advances to a transition 222 which causes the first three bit code word (a Sync word) to be latched into the Next Word Code Latch 22 at a state 224. This code word is examined and decoded at states 224, 226 and 228. The SERDES register 14 is then shifted by two bit positions, and the latches 22, 24 and 26 are stepped in bucket brigade fashion by the code latch signal at a transition 230. The second sync code word is similarly examined and decoded at states 232, 234 and 236. At the state 236 it is possible to determine if two valid encoded sync words (e.g. 100100) have been detected. If not, the process goes to the error state 218 which results in an error message that the sync words are in error.

If the sync words are properly positioned and detected, SERDES 14 is shifted two bit positions and the second sync word is latched into the Now Word Code Latch 24 at a transition 238, while the three code bits corresponding to the two high order bit positions D7 and D6 of the first data word are latched into the Next latch 22. The code bits corresponding to the second sync word are decoded at states 240, 242, and 244.

The first three code bits of the first data word are then latched from the Next latch 22 to the Now latch 24 at a transition 246. These three bits are decoded insofar as the high order decoded data bits D7 and D6 of this word are concerned at the states 248, 250 and 252. The Next, Now and Previous latches are again shifted at a transition 254, so that code bit positions corresponding to decoded data bit positions D5 and D4 are in the Now latch. The SERDES 14 is shifted by two bit positions so that the decoded D7 and D8 bits are in bit positions 3 and 4 in SERDES. The D5 and D4 code bits are processed at states 256, 258 and 260. Another shift of the latches occurs at a transition 262, (which also results in a two bit shift in SERDES) and code bit positions corresponding to decoded data bit positions D3 and D2 are in the Now latch: and these code bits are processed for decoding at states 264, 66 and 268. Once again, SERDES 14 is shifted by two bits, and the latches are shifted at a transition 270, and the code bit positions corresponding to the two low order decoded bits D1 and D0 of the first data word are now in the Now latch. These last code bits are processed at states 272 and 274.

A word bit length counter is tested at a transition 276 to be sure that it has reached zero, and the first data word is ready to be shifted out of SERDES 14 as eight decoded parallel bits D7-D0 when a state 278 is reached, so the serial request line 92 is set at the state 278.

SERDES 14 is shifted by two bits at a transition 280, and the code latches 22, 24 and 26 are also stepped at this edge 280, so that the code bits for the high order D7 and D6 bit positions of the next data word n are now in the Now latch 24. These code bits are decoded at states 282, 284 and 288.

A transition 286 between the states 284 and 288 causes the latch 12 to latch the first three code bits of the next data word.

A transition 290 causes SERDES to shift by two bit positions; and the code bits corresponding to the D5 and D4 bit positions of the n data word are then decoded at states 292, 294 and 296. SERDES 14 again shifts by two bit positions at a transition 298, and the code bits corresponding to the D3 and D2 bit positions are decoded at states 300, 302 and 304. Again, SERDES 14 is shifted by two bit positions at a transition 306, and the code bits corresponding to the low order D1 and D0 bits are decoded at states 308 and 310. A transition 312 determines that a full data word has now been framed in SERDES, and this decoded word is sent out onto the bus 44 from the SERDES 14 as the present decoded data word at the state 314 which includes the setting of the serial request line 92. Then, the SERDES 14 is shifted by two bit positions, and decoding of the next data word begins by return to the state 282. The decode process repeats the states 282 through 316 for each of the data words of the block until the entire block is decoded, including error correction code words following the end of the user data portion thereof.

The code latch line 37 is active at transition edges 230, 238, 246, 254, 262, 270, 280, 290, 298, 306, and 316, so that successive three bit code groups may be stepped through the latches 22, 24 and 26 in bucket brigade fashion, incident to the decoding process.

It is to be understood that the encoder-decoder apparatus 10 implements and follows the three to two variable length, one and seven zeros run length limited code set forth in the Table set out above. At the same time, the logic elements required for encoding and decoding of this code have been minimized in number and complexity, and common usage of other circuit elements has resulted in a highly efficient, yet low cost apparatus which fully and effectively achieves the objects of the present invention in a manner which overcomes limitations and drawbacks of the prior art processes and which advances the art.

Having thus described a presently preferred embodiment of the present invention, it will now be appreciated that the objects of the invention have been fully achieved, and it will be understood by those skilled in the art that many changes in construction and circuitry and widely differing embodiments and aplications of the invention will suggest themselves without departure from the spirit and scope of the invention. The disclosures and the description herein are intended to be illustrative and are not in any sense limiting of the invention, more particularly defined in scope by the following claims.

I claim:

1. An encoder-decoder apparatus for encoding and decoding code words in a serial bit stream path from and to components of serial data words each being of n parallel data bits in a data word transmission path, wherein the number of bits of each code word bears a three to two relation with respect to the number of bits of each component of the data word, and where n equals an even integer, the encoder decoder comprising:

clocked shift register means connected to the serial bit stream path for receiving and framing each incoming code word and for putting out each framed incoming code word in parallel bit format, and for receiving each outgoing code word in parallel bit format and for putting out each outgoing code word into the serial bit stream path, serializing and deserializing shift register latch means connected to the data word transmission path for receiving and latching each data word coming in from, and for receiving and latching each present data word going out to, the data word transmission path, said serializing and deserializing shift register latch means being clocked at two rates, a first rate corresponding to the latching of each incoming and outgoing data word of n bit length and a second rate by which the shift register latch means is shifted by the number of bits of the data word component, said serializing and deserializing shift register latch means including preceding component storage means for latching each component immediately preceding a present component of an incoming data word to be encoded, encode logic circuit means connected to predetermined bit positions of the serializing and deserializing shift register latch means including the positions corresponding to the immediately preceding component and the positions corresponding to the present component to be encoded, the encode logic circuit means also being connected to the clocked shift register means, for encoding components making up each data word into code words and sending the code words to the clocked shift register means, encoding being in accordance with a predetermined code scheme which generates the stream of variable length code words in which ONE bits thereof are separated by at least d ZERO bits and not more than k ZERO bits, decode logic circuit means connected to the clocked shift register means and to predetermined bit positions of the serializing deserializing shift register latch means for decoding incoming code words into components in accordance with the predetermined code scheme, and for sending each decoded component into the serializing deserializing shift register latch means wherein the components are framed into each parallel bit data word which is then sent out to the data word transmission path, control means connected to the clocked shift register means, the serializing deserializing shift register latch means, the encode logic circuit means and the decode logic circuit means for generating control signals for controlling encoding and decoding operations of the encoder-decoder.

2. The encoder-decoder in accordance with claim 1 wherein d equals one and k equals seven.

3. The encoder-decoder in accordance with claim 2 wherein said predetermined code scheme implemented by said encoder logic circuit means and decoded by said decoder logic circuit means is:

| Previous Component | Present Component | Previous Code Word | Present Code Word |
| --- | --- | --- | --- |
| 00 | 00 | 001 | 001 |
| 00 | 01 | 001 | 000 (Double Gp) |
| 00 | 10 | 001 | 010 |
| 00 | 11 | 010 | 000 (Double Gp) |
| 01 | 00 | 101 | 001 |
| 01 | 01 | 101 | 000 (Double Gp) |
| 01 | 10 | 101 | 010 |

-continued

| Previous Component | Present Component | Previous Code Word | Present Code Word |
| --- | --- | --- | --- |
| 01 | 11 | 100 | 000 (Double Gp) |
| 10 | 00 | 010 | 001 |
| 10 | 01 | 010 | 101 |
| 10 | 10 | 010 | 010 |
| 10 | 11 | 010 | 100 |
| 11 | 00 | 100 | 001 |
| 11 | 01 | 100 | 101 |
| 11 | 10 | 100 | 010 |
| 11 | 11 | 100 | 100 |

4. The encoder-decoder in accordance with claim 1 further comprising preamble test detection means connected to the clocked shift register means for detecting the presence of a predetermined preamble code pattern during decode operations.

5. The encoder-decoder in accordance with claim 1 further comprising synchronizing pattern detection means for detecting the presence of a predetermined synchronizing pattern during decode operations.

6. The encoder-decoder in accordance with claim 1 wherein the encode logic circuit means includes preamble pattern generation means for causing the logic elements to generate at least one predetermined preamble pattern which is not in accordance with the predetermined code scheme.

* * * * *